United States Patent [19]
Guillot, Jr.

[11] 3,848,078

[45] Nov. 12, 1974

[54] HYBRID ELECTRONIC CIRCUIT EMPLOYING MESHED SUPPORT

[75] Inventor: Joseph M. Guillot, Jr., Dallas, Tex.

[73] Assignee: Collins Radio Company, Dallas, Tex.

[22] Filed: Sept. 12, 1973

[21] Appl. No.: 396,653

[52] U.S. Cl. ............ 174/52 S, 29/627, 174/DIG. 3, 357/74

[51] Int. Cl. .............................................. H05k 5/00

[58] Field of Search ............ 174/15 R, 52 S, 52 PE, 174/DIG. 3, DIG. 5, 84 R; 317/234 A, 100, 101 CP, 101 CC, 101 CM; 29/626, 627

[56] References Cited

UNITED STATES PATENTS

| | | | |
|---|---|---|---|
| 2,972,657 | 2/1961 | Stemke | 174/84 R |
| 3,784,726 | 1/1974 | Smith et al. | 174/DIG. 3 X |

*Primary Examiner*—Darrell L. Clay
*Attorney, Agent, or Firm*—Bruce C. Lutz

[57] ABSTRACT

A hybrid circuit operating in a temperature variable environment employs a meshed support for solderably attaching the ceramic substrate to a heat conducting metal housing or carrier whereby thermally-induced stresses do not destroy the solder bond.

4 Claims, 6 Drawing Figures

HYBRID ELECTRONIC CIRCUIT EMPLOYING MESHED SUPPORT

BACKGROUND OF THE INVENTION

This invention relates to hybrid microelectronic circuitry, and more particularly to the housing and support means for such circuitry.

Electronic circuitry today is embodied primarily in microcircuitry. Whereas digital microcircuitry normally comprises integrated semiconductor circuits, much of the linear, higher frequency circuitry utilizes hybrid thick and thin film circuits. Hybrid circuits typically employ a ceramic substrate on which conductive circuits are defined by selective deposition or etching of a conductive film with discrete devices and integrated circuits mounted thereon and interconnected by the conductive circuitry. The completed substrates are then packaged inside a carrier with the substrate soldered to the interior circuit of the carrier for support and for electrical connection with the ground plane normally defined on the interior circuit.

Problems have been encountered with such hybrid circuits which experience wide temperature cycling through either high-power operation or working environment. Specifically, such temperature cycling has occasioned fracture of the solder joints holding the substrate to the carrier.

SUMMARY OF THE INVENTION

An object of the present invention is an improved hybrid circuit operable in a temperature variable environment.

Another object of the invention is improved housing and support means for hybrid circuits.

Still another object of the invention is bonding support means which will withstand thermally induced stresses.

In accordance with the invention a meshed support means is provided for bonding two different members in a temperature variable environment. As used herein, a meshed support means may comprise a multifilament element such as a braid or screen or a unitary member with a mesh pattern defined therein. Such a mesh support means is capable of withstanding thermal stresses and maintaining structural support and electrical interconnections between two members having different coefficients of thermal expansion which are exposed to a temperature variable environment.

These and other objects and features of the invention will be more fully understood from the following detailed description and appended claims when taken with the drawing.

DETAILED DESCRIPTION OF EMBODIMENTS

Figure 1:
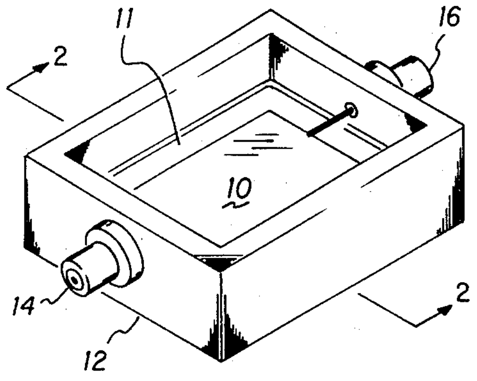
FIG. 1 is a perspective view of a hybrid electrical circuit.

Referring now to the drawing, FIG. 1 is a perspective view of a hybrid electrical circuit 10 defined on a ceramic substrate 11 which is mounted in a carrier 12 with the cover removed therefrom. Input and output coaxial connectors 14 and 16 are provided at either end of carrier 12 to permit interconnection with the hybrid circuit therein. Typically, in a power amplifier application carrier 12 comprises a heavy-gauge aluminum body to facilitate heat removal from circuit 10 and substrate 11, and the carrier 12 may also function as a ground plane for the circuit 10.

Figure 2:
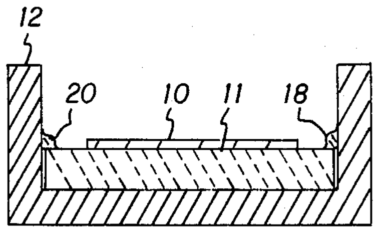
FIG. 2 is a section view of the hybrid circuit of FIG. 1 taken along the line 2—2.

Referring to the section view in FIG. 2 taken along lines 2—2 of FIG. 1, substrate 11 is physically and electrically fastened in carrier 12 by means of solder joints 18 and 20. To facilitate this soldering, solder pads on ceramic substrate 11 are defined by means of depositing layers of gold and titanium on the ceramic substrate and providing corresponding bonding pads on aluminum carrier 12 by means of electroless plating of nickel on the aluminum carrier and providing silver plating thereon. A lead-tin solder may be used with such solder pads. In soldering the lead-tin to a gold surface it has been found advisable to plate copper or silver over the gold surface in the solder areas to prevent leaching of gold into the lead-tin solder and embrittlement of the solder.

As discussed above, differences in thermal coefficients of expansion of the ceramic substrate 11 and the aluminum carrier 12 may create failure modes in the cracking of the solder bonding when such hybrid circuits are thermally cycled. For example, an alumina ceramic substrate has a coefficient of thermal expansion of $-4.3 \times 10^{-6}$ inch/inch F° while aluminum has a coefficient of thermal expansion of $-13 \times 10^{-6}$ inch/inch F°, and such circuits must withstand thermal cycling over a temperature range exceeding 100°C. Solder bonds often cannot withstand the thermally induced stresses applied thereto over such a temperature range, and attendant circuit failure presents an acute problem.

In accordance with the present invention, a meshed support means is provided for bonding two different members in a temperature variable environment such as an alumina ceramic substrate and an aluminum housing. As used herein a meshed support may comprise a multifilament element such as a braid or screen or the support may comprise a unitary member with a mesh pattern defined therein by etching or the like. Applicants have found that such a meshed support means is capable of withstanding thermal stresses and maintaining structural support and electrical interconnection between two members having different coefficients of thermal expansion which are exposed to a temperature varying environment.

Figure 3:
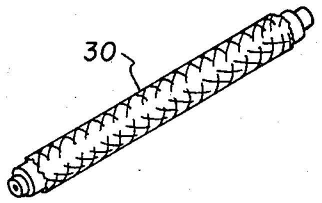
FIG. 3 is a perspective view of a meshed support means useful in supporting hybrid circuits in accordance with the present invention.
Figure 4:
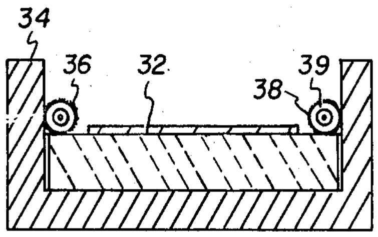
FIG. 4 is another section view of a hybrid circuit including the meshed support means of FIG. 3.

FIG. 3 is a perspective view of a meshed support means comprising a cylindrical braid 30 such as is found in shielded coaxial line, for example. Such a braid typically includes multiple strands of interwoven tin-coated or silver-coated copper wire which is readily solderable. Referring to FIG. 4, another section view of a hybrid circuit, substrate 32 is shown mounted in carrier 34 by means of meshed support braids 36 and 38. To facilitate the soldering of braids 36 and 38 to the carrier 34 and the substrate 32, a teflon core insert 39 may be positioned within the braids thereby maintaining the cylindrical configuration of the braid during soldering and preventing solder accumulation therein. Such a braid support means has proved to be very successful in eliminating the circuit failure mode previously encountered during thermal cycling.

Figure 5:
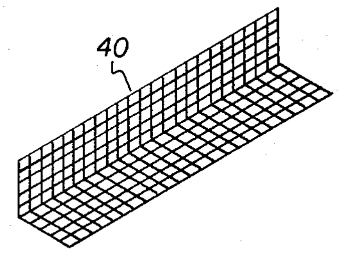
FIG. 5 is a perspective view of another meshed support means useful in supporting hybrid circuits.
Figure 6:
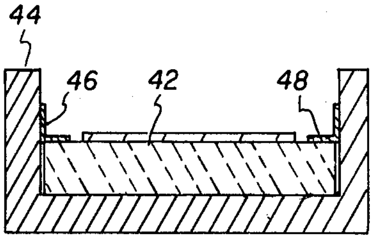
FIG. 6 is another section view of a hybrid circuit including the meshed support means of FIG. 5.

FIG. 5 is a perspective view of another meshed support means comprising mesh 40 which may consist of either a wire screen or a unitary member with the mesh pattern defined therein by etching or the like. Referring to FIG. 6, another section view of a hybrid circuit shows a ceramic substrate 42 mounted in carrier 44 by means of mesh supports 46 and 48 of the type illustrated and described with reference to FIG. 5.

Meshed support means have proved very successful in eliminating support failure modes attendant with temperature cycling in hybrid electrical circuits, particularly with power amplifiers which generate considerable heat within a confined space and consequently must operate over a relatively wide temperature range. While the invention has been described with reference to specific embodiments, the description is illustrative and is not to be construed as limiting the invention. Various modifications and changes may occur to those skilled in the art without departing from the true scope and spirit of the invention as defined by the appended claims.

I claim:

1. A hybrid electronic circuit comprising a ceramic substrate having a circuit pattern defined thereon and solder pads defined near peripheral portions thereof; a metal carrier including a cavity receiving said substrate and having solder pads defined on interior surfaces thereof; and meshed support means soldered to said solder pads of said substrate and to said solder pads of said carrier thereby physically attaching said substrate to said carrier within said cavity.

2. A hybrid electronic circuit as defined by claim 1 wherein said meshed support means comprises a cylindrical multifilament braid.

3. A hybrid electronic circuit as defined by claim 1 wherein said meshed support means comprises a meshed multifilament screen.

4. A hybrid electronic circuit as defined by claim 1 wherein said meshed support means comprises a unitary member having a mesh pattern defined therein.

* * * * *